US010692719B2

(12) United States Patent
Naseem et al.

(10) Patent No.: US 10,692,719 B2
(45) Date of Patent: Jun. 23, 2020

(54) SHELL-ENABLED VERTICAL ALIGNMENT AND PRECISION-ASSEMBLY OF A CLOSE-PACKED COLLOIDAL CRYSTAL FILM

(71) Applicant: ALIGND SYSTEMS AB

(72) Inventors: Umear Naseem, Lund (SE); Klaus Kunze, Lund (SE)

(73) Assignee: AligND Systems AB, Lund (SE)

( * ) Notice: Subject to any disclaimer, the term of this patent is extended or adjusted under 35 U.S.C. 154(b) by 32 days.

(21) Appl. No.: 15/524,920

(22) PCT Filed: Nov. 9, 2015

(86) PCT No.: PCT/IB2015/002227
§ 371 (c)(1),
(2) Date: May 5, 2017

(87) PCT Pub. No.: WO2016/071762
PCT Pub. Date: May 12, 2016

(65) Prior Publication Data
US 2017/0358448 A1    Dec. 14, 2017

Related U.S. Application Data

(60) Provisional application No. 62/076,913, filed on Nov. 7, 2014.

(51) Int. Cl.
H01L 21/02 (2006.01)
H01L 31/0352 (2006.01)
H01L 31/18 (2006.01)

(52) U.S. Cl.
CPC .. *H01L 21/02603* (2013.01); *H01L 21/02645* (2013.01); *H01L 21/02653* (2013.01); *H01L 31/035227* (2013.01); *H01L 31/18* (2013.01)

(58) Field of Classification Search
CPC . C23C 18/1844; C23C 18/1893; C23C 18/31; C23C 18/44; H01L 31/035209–035236; H01L 29/0665–068; H01L 21/02601; B05D 1/18–208; B22F 1/008; B22F 1/0022; B22F 1/0025; B22F 2001/0033; B22F 2001/0037
See application file for complete search history.

(56) References Cited

U.S. PATENT DOCUMENTS

| 7,105,052 B1 | 9/2006 | Schlenoff |
| 2008/0079104 A1* | 4/2008 | Stewart .......... B82Y 20/00 257/433 |

(Continued)

FOREIGN PATENT DOCUMENTS

| CN | 101803035 A | 8/2010 |
| JP | 2011504291 A | 2/2011 |

(Continued)

OTHER PUBLICATIONS

International Preliminary Report on Patentability from the International Bureau for International Patent Application No. PCT/IB15/02227, dated May 18, 2017, 7 pages.

(Continued)

*Primary Examiner* — Eric R Smith
(74) *Attorney, Agent, or Firm* — The Marbury Law Group, PLLC

(57) ABSTRACT

A nanowire includes an electrically conductive catalyst nanoparticle first portion, a semiconductor wire second portion, a first dielectric shell around the first portion, and a second dielectric shell or functionalization around the second portion. A material of the second dielectric shell or functionalization is different from a material of the first shell.

13 Claims, 5 Drawing Sheets

(56) References Cited

U.S. PATENT DOCUMENTS

| | | | | |
|---|---|---|---|---|
| 2010/0291697 A1* | 11/2010 | Mirkin | ............... | B22F 1/02 |
| | | | | 436/94 |
| 2011/0177683 A1 | 7/2011 | Kahen | | |
| 2011/0253982 A1 | 10/2011 | Wang et al. | | |
| 2011/0315201 A1* | 12/2011 | Lin | ............... | B82Y 20/00 |
| | | | | 136/255 |
| 2013/0098288 A1* | 4/2013 | Samuelson | ............ | B82Y 30/00 |
| | | | | 117/86 |
| 2013/0112940 A1* | 5/2013 | Kurtin | ............... | C01B 19/007 |
| | | | | 257/13 |
| 2014/0175372 A1* | 6/2014 | berg | ............... | H01L 31/022466 |
| | | | | 257/9 |

FOREIGN PATENT DOCUMENTS

| | | |
|---|---|---|
| JP | 2013526474 A | 6/2013 |
| KR | 20100128977 A | 12/2010 |
| WO | WO2008072479 A1 | 6/2008 |
| WO | 2012051482 A2 | 4/2012 |
| WO | 2013080174 A1 | 6/2013 |
| WO | 2013154490 A2 | 10/2013 |
| WO | 2013155590 A2 | 10/2013 |
| WO | WO2013154490 A2 | 10/2013 |
| WO | WO2014096962 A2 | 6/2014 |
| WO | 2015166416 A1 | 11/2015 |

OTHER PUBLICATIONS

International Search Report and written Opinion for PCT/IB15/02227, dated Apr. 25, 2016.

Jinyao Tang et al: "Solution-processed core-shell Nanowires for efficient Photovotlaic cells", Nature Nanotechnology, vol. 6, No. 9, Jun. 22, 2011 (Jun. 22, 2011), pp. 568-572.

Maoqing Yao et al: "GaAs Nanowire Array Solar Cells with Axial p-i-n Junctions" Nano Letters, vol. 14 No. 6, Jun. 11, 2014 (Jun. 11, 2014), pp. 3293-33039.

Thomas J. Kempa et al: "Single and Tandem Axial p-i-n Nanowire Photovoltaic Devices" Nano Letters, vol. 8, No. 10, Oct. 8, 2008 (Oct. 8, 2008), pp. 3456-34609.

Josef A. Czaban et al: "GaAs Core-Shell Nanowires for Photovoltaic Applications" Nano Letters, vol. 9, No. 1, Jan. 14, 2009 (Jan. 14, 2009) pp. 148-1549.

First Office Communication from the State Intellectual Property Office for PRC (China) Patent Application No. 201580066524.3, dated Aug. 3, 2018, 15 pages.

Tang, J. et al., "Solution-processed core-shell Nanowires for efficient Photovoltaic cells," Abstract of Nature Nanotechnology, vol. 6, No. 9, pp. 568-572, 1 page, (2011).

Yao, M. et al., Ming Hsieh Department of Electrical Engineering and Center for Energy Nanoscience, "GaAs Nanowire Array Solar Cells with Axial p-i-n Junctions," Nano Letters, vol. 14, No. 6, pp. 3293-3303, 2 pages, (2014).

Office Action from Japan Patent Office for Japanese Patent Application No. 2017-524430, dated Jun. 29, 2018, 9 pages.

Goto, H. et al., "Growth of Core-Shell InP Nanowires for Photovoltaic Application by Selective-Area Metal Organic Vapor Phase Epitaxy", Applied Physics Express, vol. 2, p. 035004-1-035004-3, (2009).

Adachi, M.M. et al., "Core-shell silicon nanowire solar cells", Scientific Reports, vol. 3, pp. 1-6, (2013).

Second Office Communication from the China National Intellectual Property Administration ("CNIPA") for PRC (China) Patent Application No. 201580066524.3, dated May 22, 2019, 13 pages.

Office Communication, Decision of Rejection, from the China National Intellectual Property Administration ("CNIPA") for PRC (China) Patent Application No. 201580066524.3, dated Apr. 2, 2020, machine translation is included, 24 pages.

* cited by examiner

Combined to form differential shell

SHELL-ENABLED VERTICAL ALIGNMENT AND PRECISION-ASSEMBLY OF A CLOSE-PACKED COLLOIDAL CRYSTAL FILM

CROSS-REFERENCE TO OTHER APPLICATIONS

This application is a national phase application under 35 U.S.C. § 371 of international application PCT/IB15/02227, filed Nov. 9, 2015 which claims the benefit of priority to U.S. Provisional Application No. 62/076,913 filed on Nov. 7, 2014, the entire teachings of which are incorporated herein by reference.

FIELD

The present invention is generally directed to assembly and alignment of nanowires and in particular to assembly of shell-enabled vertical alignment and assembly of nanowires into a close-packed colloidal crystal film.

BACKGROUND

PCT Published Application WO 2013/155590 A2 published on 17 Oct. 2013 and incorporated herein by reference describes a device that includes a plurality of nanowires functionalized with different functionalizing compounds. The method includes functionalizing the nanowires with a functionalizing compound, dispersing the nanowires in a polar or semi-polar solvent, aligning the nanowires on a substrate such that longitudinal axes of the nanowires are oriented about perpendicular to a major surface of the substrate, and fixing the nanowires to the substrate.

SUMMARY

An embodiment is drawn to a nanowire which includes an electrically conductive catalyst nanoparticle first portion, a semiconductor wire second portion, a first dielectric shell around the first portion, and a second dielectric shell or functionalization around the second portion. A material of the second dielectric shell or functionalization is different from a material of the first shell.

Another embodiment is drawn to a method of forming a nanowire close-packed structure including providing a nanowire batch comprising nanowires with a seed portion and a nanowire portion and forming a first shell encapsulating one portion of the nanowire in a nanowire batch and forming a second shell or functionalization encapsulating a second portion of the nanowire in a nanowire batch. The second shell or functionalization material is different from the first shell material.

Another embodiment is drawn to method of forming a nanowire close-packed structure including providing a nanowire batch comprising nanowires with a seed portion and a nanowire portion forming dielectric shell encapsulating the nanowires in the nanowire batch and orienting and aligning the nanowires perpendicular to an interface of a first liquid with one of a second liquid, a solid or air.

Another embodiment is drawn to a photovoltaic device comprising nanowires comprising a differential shell surrounding the nanowires.

Another embodiment is drawn to a nanowire batch comprising nanowires encapsulated in a shell, where the spacing between individual nanowires is controlled by a thickness of the shell.

DETAILED DESCRIPTION

Figure 1:
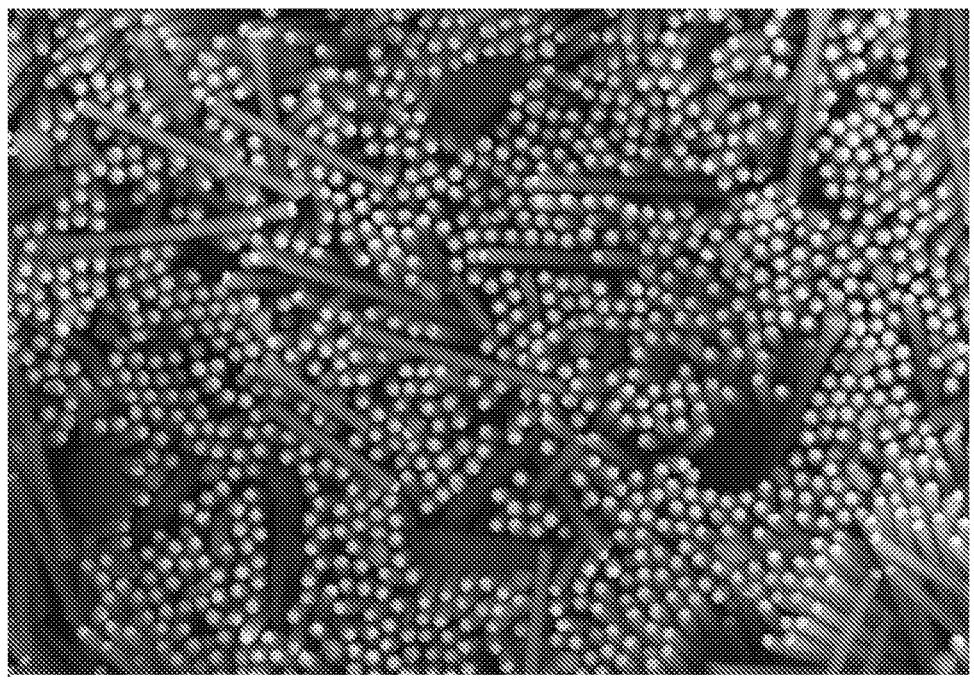
FIG. 1 is a scanning electron microscope (SEM) micrograph of an aligned assembly of nanowires according to an embodiment.

The present inventors realized that it may be preferable to form a differential shell structure rather than different functionalization on different portions of nanowires ("NWs") to obtain distinct nanowire ("NW") portions that have different physical properties. These nanowires may be used to form an ink that allows alignment of the nanowires in a two-phase system, such as the two phase system described in Swedish patent application number SE 1430057-8 filed 29 Apr. 2014, and incorporated herein by reference in its entirety.

By forming a shell (e.g., a continuous layer having a thickness of at least 2 nm) instead of a monolayer functionalization coating as described in WO 2013/155590, it is possible to control the spacing between NWs in a close-packed and oriented assembly. By close-packing (i.e., where the shells of the adjacent nanowires touch each other), the angle offset of each NW may be minimal as well.

Thus, the problem of forming assemblies of vertically aligned nanowires that are oriented at a liquid/liquid, liquid/solid or liquid/air interface with defined spacing may be solved by using nanowires that are encapsulated in a differential shell. That is, the shell comprises a first portion of a first material and a second portion of a different second material. In an embodiment, the first shell material substantially covers the seed portion (i.e., the metal or metal alloy catalyst nanoparticle, such as a gold nanoparticle) of the nanowire and the second shell material substantially covering the "wire" (e.g., the semiconductor material) portion of the nanowire. Furthermore, the problem is also solved by nanowires being encapsulated in a partial shell where the shell comprises a material that only covers either the seed portion of the nanowire or the wire portion of the nanowire. The portion that is not covered by a shell can be surface functionalized according to WO 2013/155590 to make the uncovered portion substantially different from the shell covered portion of the nanowire. In an embodiment, the surface properties of the first material are substantially different from the surface properties of the second material, as discussed in more detail below. This difference in surface properties facilitates orientation at a liquid/liquid, liquid/solid or liquid/air interface. The properties of the first shell and second shell or functionalization material and the interface materials determine the orientation of the nanowires.

In one embodiment, the first and second shell materials are different insulating materials and are not semiconductor materials. The first and second materials may be organic or inorganic insulating materials, such as polymer, glass or ceramic insulating materials. The first shell material may be an organic material, such as a polymer material, while the second shell material may be an inorganic glass or ceramic material, such as amorphous or crystalline silicon oxide (e.g., silica, $SiO_2$).

Furthermore, by surrounding the nanowire with a shell, batches of nanowires with both a narrower size distribution and an altered aspect ratio (ratio between width and length of nanowire) can be achieved. By altering the geometry of the nanowires in this way, spontaneous self-assembly is facilitated, which may further lead to colloidal crystallization in larger areas. The size of the shell determines the spacing between the close-packed nanowires. The assembly process may be further assisted by using mechanical means such as a Langmuir-Blodgett (LB) trough and/or thermal convection.

In an embodiment, the problem of forming assemblies of vertically aligned nanowires that are (A) oriented at a liquid/liquid or liquid/air interface with (B) defined spacing is solved encapsulating the nanowires in a shell where the shell comprises a first material and a second material. The first material substantially covers the seed portion (e.g., the catalyst nanoparticle) of the nanowire and the second material substantially covers the semiconductor wire portion of the nanowire. The spacing between adjacent nanowires may be controlled by the thickness of the shell. The surface properties of the first material are preferably substantially different from the surface properties of the second material to facilitate orientation at a liquid/liquid or liquid/air interface. Problem (A) is solved by encapsulating the nanowires in a differential shell while problem (B) is independently solved by a significant shell thickness regardless of the use of a differential shell.

Alignment: Altering the geometry of the nanowire by nanowire encapsulation allows for a narrower, more uniform particle size distribution. A narrower spread of the particle size distribution allows for better alignment and/or alignment of nanowires over a larger area with fewer defects. Altering the geometry also alters the aspect ratio of the NWs. A lower aspect ratio allows for better alignment and/or alignment of NWs over a larger area with fewer defects.

Orientation: The level of orientation uniformity is determined by the thickness of the shell, the differentiality introduced by a differential shell or a partial shell with an additional surface functionalization on the part that is not covered by a shell and/or the features of the liquid/air interface.

Spacing: Control over shell size leads to controlled spacing between nanowires.

Isolation of individual nanowires: When assembled, the semiconductor nanowires or metal catalyst particles cannot touch other semiconductor nanowires or catalyst particles and thereby short each other because of the insulating shell. In other words, because the semiconductor nanowires and metal catalyst particles are encapsulated in an insulating shell, only the insulating shells contact each other.

Rigid chemical handle: A surrounding shell with a more versatile chemistry allows for better control and manipulation of the nanowire ink. For example, it is typically easier to work with a silica surface than with a GaAs surface.

Differential shell: A differential shell allows for advantages that comes with a uniform shell and further includes the polar properties of the nanowires. The polar properties may be used to orient and assemble the nanowires.

Surface passivation: An encapsulating shell may lead to surface passivation of the nanowires.

Controlled geometry and narrowed relative size distribution: When the nanowires are encapsulated in a shell, the geometry can be controlled and the size may be made significantly larger. The ink already has a size distribution, and while the absolute size distribution may be the same after encapsulation in a shell, the relative size distribution becomes much lower, especially for the width.

Nanowire precursors: The encapsulated nanowire structure poses less stringent requirements on the geometry distribution of nanowire batches (wires without shell) whether fabricated by aerotaxy, MOCVD or other methods. Further, the encapsulated nanowire structure opens up parameter space in the sense that nanowire batches with a larger distribution in length can be used without running into shorting problems. That is, it does not matter if a few nanowires are etched too far, they simply do not contribute to the overall efficiency. Additionally, there is no need to form shells during the aerotaxy process or MOCVD growth The differential shell covered nanowires may be aligned using a two-phase alignment (e.g., liquid/liquid or liquid/air) followed by evaporation-induced self-assembly. Further, shells may be formed through various chemistries as discussed in more detail below.

Examples of chemistries includes silica chemistry to form a silica second shell material around the wire portion of the nanowire and atom transfer radical polymerization (ATRP) chemistry to form a polymer first shell material on the seed portion of the nanowire. Thus, chemistries such as inorganic silica chemistry and polymer chemistry may be utilized to form shells. Alternatively, surfactant chemistry may be used to form the shells. While silica and polymer shells are described above for illustration, other inorganic (e.g., alumina or silicon nitride) or organic insulating materials may also be used to form the shell(s). Preferably, the material of one shell is more is more hydrophobic or hydrophilic than the material of the other shell or functionalization.

The two different shells may be selectively formed through the utilization of the different properties/materials of the nanowire. That is, the surface of one material (e.g., the metal catalyst particle or semiconductor nanowire) may be used to selectively form the first shell and the surface of the other material (e.g., the semiconductor nanowire or metal catalyst particle) to selectively form the second shell or functionalization.

The first shell may be hydrophilic, while the second shell or functionalization is hydrophobic—or vice versa. In an embodiment, while the first part of the nanowires (e.g., the metal catalyst particle or semiconductor nanowire) contains the insulating shell that is either hydrophilic or hydrophobic, the remaining second part of the nanowires (e.g., the semiconductor nanowire or the metal catalyst particle) may be functionalized with either compounds that render the second part of the nanowires hydrophobic or hydrophilic, which is opposite to that of the insulating shell. Hydrophobic functionalization compounds include but are not limited to alkanes or fluoro-compounds such as perfluorodecane thiol, pentanethiol, dodecyltrichlorosilane, stearic acid, decyl phosphonic acid, 5-(1,2-dithiolan-3-yl)-N-dodecylpentanamide, sodium dodecyl sulfate, or triphenyl phosphine, octadecylthiol. Hydrophilic functionalization compounds include but are not limited to sulphates, phosphates, carboxylates, amines, or polyethers, for example sodium mercaptopropane sulfonate, sodium mercaptoethane sulfonate, mercaptoalkane succinate (2-mercaptosuccinate), mercaptoalkane amine, (11-mercaptoundecyl)-N,N,N-trimethylammonium bromide, (12-Phosphonododecyl)phosphonic acid, (±)-1,2-Dithiolane-3-pentanoic acid, (2-Ammonioethyl)di-tert-butylphosphonium bis(tetrafluoroborate), (3-Aminopropyl)triethoxysilane, or 12-mercaptododecanoic acid.

By adjusting the reaction parameters, the size and shape of the shells may be controlled, resulting in a control over the spacing achieved between nanowires.

In one embodiment, a differential shell is located around the nanowire introducing inter-nanowire spacing while retaining its differential properties.

In one embodiment, a partial shell may be located around either the seed or the wire portion of the nanowire and the non-covered portion is surface functionalized so that the surface properties of the shell is substantially different from the surface functionalization. The shell may be substantially hydrophilic relative to the surface functionalization, which in turn is substantially hydrophobic relative to the shell. The partial shell introduces inter-nanowire spacing while retaining the nanowires differential properties.

First Shell Encapsulation Embodiment

Figures 2A, 2B, 2C:
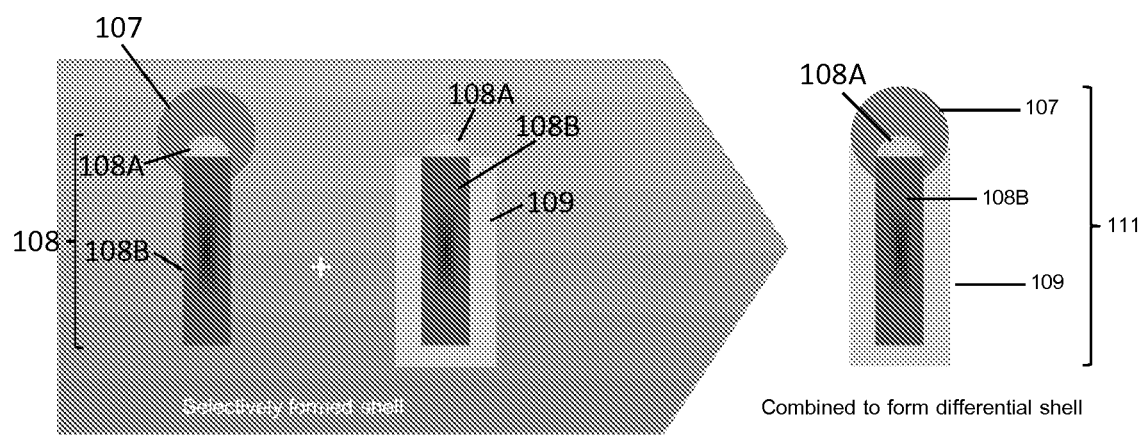
FIGS. 2A-2C are schematic illustrations of a method of making nanowires having a differential shell structure.

In a first embodiment illustrated in FIG. 2A, the seed portion 108A of the nanowire 108 is substantially covered by a first material, such as more than 95% covered, such as more than 98% covered to form a first shell 107. This may be done by covering the seed portion 108A with a ligand that binds selectively to the seed 108A. In an embodiment, the seed 108A comprises Au (e.g., a gold nanoparticle). The Au specific ligand bis[2-(2'-bromoisobutyryloxy)ethyl]disulfide is used to selectively cover it, forming the first shell 107. The ligand contains a moiety (in this embodiment bromoisobutyryloxy) that is utilized to initiate atom-transfer radical-polymerization (ATRP) with styrene as the monomer and a metal/ligand complex of CuBr and N,N,N',N',N"-pentamethyldiethylenetriamine acting as a catalyst at an elevated temperature of 130° C. under inert conditions, yielding a first shell 107 comprising polystyrene substantially covering the seed portion 108A of the nanowire 108.

Second Shell Encapsulation Embodiment

In another embodiment illustrated in FIGS. 2B and 2C, the nanowire 108 with a first shell 107 (e.g. polystyrene) substantially covering the seed portion 108a of the nanowire 108 is further covered with a ligand that binds preferentially to the semiconductor wire portion 108B of the nanowire 108. In an embodiment, the wire portion 108B of the nanowire 108 comprises GaAs, and the ligand used to cover it is (3-aminopropyl)trimethoxysilane. This ligand contains a moiety (in this embodiment trimethoxysilane) that is used to form an amorphous silica shell on the wire portion 108B by continuous addition of either tetraethoxyorthosilicate as the monomer or oligomeric dimethylsiloxane under either alkaline conditions (e.g. a mixture of ethanol/concentrated NH4OH, 9:1 as solvent) or acidic conditions (e.g. ethanol/concentrated HCl, 9:1 as solvent), yielding a second shell 109 covering the wire portion 108B of the nanowire 108 and finally resulting in a combined differential shell 111 as illustrated in FIG. 2C. In an alternative embodiment the order of forming the two shells 107, 109 may be reversed, or one of the shells 107, 109 may be replaced with a functionalization of the opposite hydrophobicity or hydrophilicity from the that of the remaining shell.

Alignment at a Liquid/Liquid Interface Embodiment

In an embodiment, a nanowire batch/array encapsulated in a differential shell 111 is used to form a close-packed assembly of oriented and aligned nanowires. In an embodiment, the nanowires 108 include a seed portion 108A covered by a first polystyrene shell 107 and a wire portion 108B covered by a second amorphous silica shell 109. In an embodiment, the net thickness of the first and second shells 107, 109 is approximately 100 nm and the diameter of the nanowire portion 108B is 200 nm. In this embodiment, the total diameter of the encapsulated nanowire 108 is increased by 200 nm versus the uncoated nanowire 108. The surface properties of the first shell 107 are preferably substantially different from the second shell 109. In an embodiment, the first shell 107 is substantially hydrophobic relative to the second shell 109, which in turn is substantially hydrophilic relative to the first shell 107.

In this embodiment, a liquid/liquid interface is formed selecting two liquids with substantially different polarity (as described in more detail in the discussion of FIG. 5 below), where the top phase 104 includes a hydrophobic solvent such as cyclopentanone and the bottom phase 102 includes a hydrophilic solvent such as water. The polarities of the solvents are preferably matched with the differential surface properties of the nanowire shells 107, 109 such that the nanowires assemble and orient at the interface 106. The orientation of particular nanowires 108 is determined by the first and second shells 107, 109 and their interaction with the top and bottom phases 104, 102. In this embodiment, the hydrophobic shell portion 107 prefers the hydrophobic solvent 104, whereas the hydrophilic shell portion 109 prefers the hydrophilic solvent 102 resulting in a unidirectional orientation of the nanowires 108 forming an assembly of close-packed colloidal crystal film. The distance between the nanowires 108 as measured from the midpoint of one nanowire 108 to the other is approximately 400 nm. By adding the nanowire batch to the liquid/liquid system, the nanowires 108 assemble and orient at the interface 106 forming a close-packed colloidal crystal film 112 in which the insulating shells of adjacent nanowires contact each other that can be transferred onto a solid substrate 116 by immersing the substrate and capturing the film 112 onto it.

Alignment at a Liquid/Air Interface Embodiment

In one embodiment, a nanowire batch encapsulated in a differential shell 111 includes the seed portion 108A of the nanowire 108 covered by a first polystyrene shell 107 and the wire portion 108B of the nanowire 108 covered by a second amorphous silica shell 109. In this embodiment, the thickness of the first and second shells 107, 109 are 20 nm (increasing the total diameter of the nanowire 108 by 40 nm). In an embodiment, the diameter of the nanowire portion 108B is 200 nm. These nanowires 108 are used to form a close-packed assembly of oriented and aligned nanowires 108. The surface properties of the first shell 107 are preferably substantially different from the second shell 109. The first shell 107 is substantially hydrophobic relative to the second shell 109, which in turn is substantially hydrophilic relative to the first shell 107.

Figure 9:
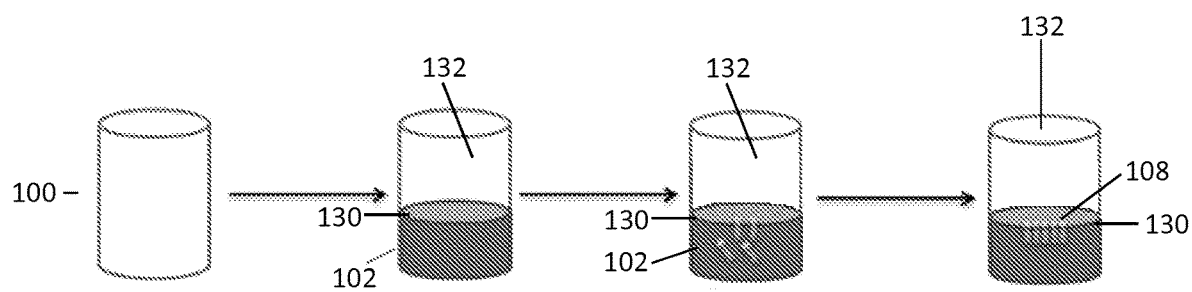
FIG. 9 is a schematic illustration of a method of capturing and aligning an assembly of nanowires according to an embodiment.

In this embodiment as illustrated in FIG. 9, a liquid 102/air 132 interface 130 is formed by selecting a hydrophilic liquid 102, such as ethanol, that interacts with the second shell material 109, such that nanowires 108 assemble and orient at the interface 130. Orientation of particular nanowires 108 is determined by the configuration of the first and second shell 107, 109 materials and their interaction with the interface materials (e.g. hydrophilic liquid 102 and air 132). In this embodiment, the hydrophobic shell 107 prefers the air phase 132, whereas the hydrophilic shell 109 prefers the hydrophilic solvent 102 resulting in a unidirectional orientation of the nanowires 108 forming an assembly of close-packed colloidal crystal film. The distance between the nanowires 108 as measured from the midpoint of one nanowire 108 to the other is 240 nm (as shown in FIG. 1). Letting the solvent evaporate on a solid substrate results in formation of a close-packed colloidal crystal film.

In an alternative embodiment, a uniform shell may be formed around the nanowire encapsulating nanowires having differential properties. This results in a single consistent surface around the whole nanowire to control the internanowire spacing.

The thickness of the shell is preferably at least 2 nm, such as least 10 nm, preferably at least 100 nm, for example 20 to 500 nm. For example, the thickness of the shell may be selected such that the average spacing of the nanowires 108 in a batch, where the shells of adjacent nanowires 108 contact each other as measured from midpoint of one nanowire 108 to the next, is larger than 200 nm and smaller than 700 nm (e.g., the nanowire diameter may be 100 to 200 nm, and the shell thickness may be 20 to 500 nm).

Figure 10:
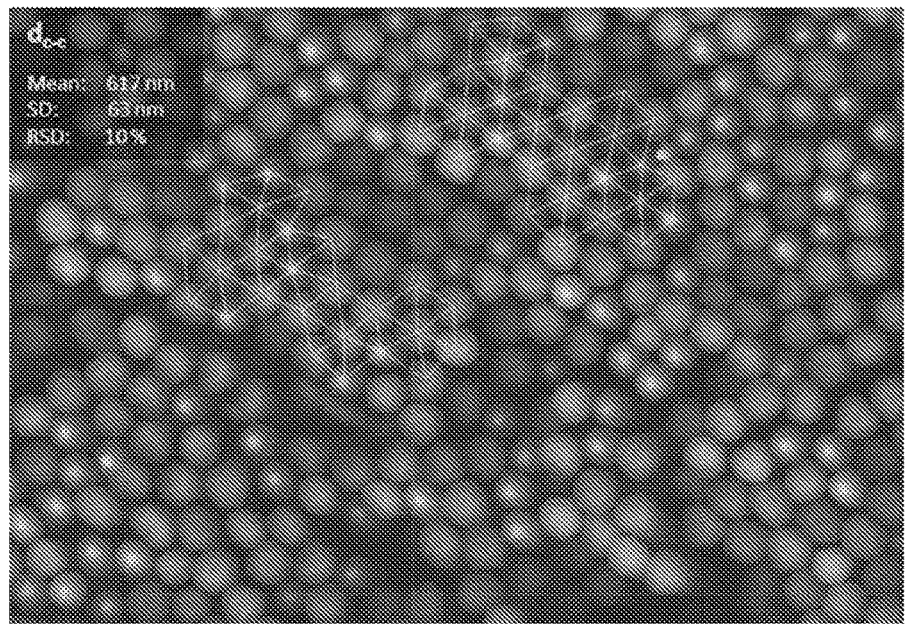
FIG. 10 is a micrograph of a colloidal crystal with center to center spacing of approximately 600 nm due to a 200 nm shell size around each nanowire.

In one embodiment, a 200 nm uniform shell around a nanowire with 200 nm diameter and 2000 nm length effectively lowers its aspect ratio from 10 to 4. This altered geometry allowed for better alignment and better quality of alignment over larger areas during liquid-air alignment with a nanowire to nanowire distance of approximately 400 nm depending on the angle offset between the nanowires, and a center to center distance of approximately 600 nm as shown in FIG. 10.

The nanowires may contain a semiconductor pn or pin junction and may comprise axial or radial core/shell type nanowires. That is, opposite conductivity type materials may be separated in the axial or radial direction. Different semiconductor materials (e.g., different III-V semiconductor materials) may be used for different portions of the nanowire.

Figure 8:
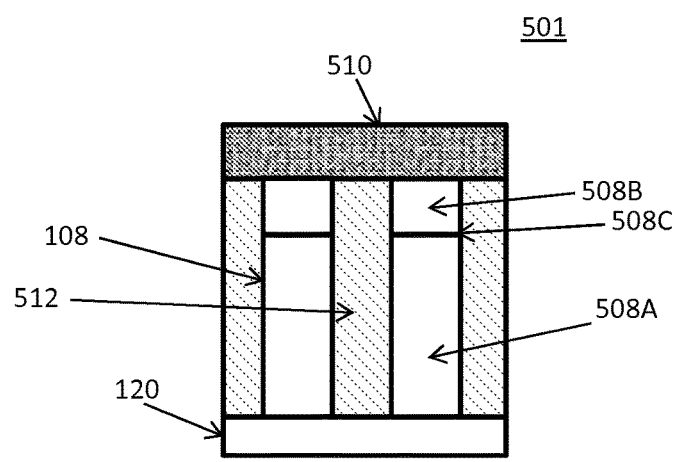
FIG. 8 is a schematic side cross sectional view of a solar cell according to an embodiment.

In an embodiment, the shell 109 preferably comprises an insulating (i.e., dielectric) material which surrounds one or more semiconductor materials (e.g., the axially or radially separated semiconductor materials) of the wire portions 108B of the nanowires 108. The nanowires 108 may be used in any suitable electronic device, such as a solar cell. An example of a solar cell 501 containing a nanowire photovoltaic absorber and nanowire alignment at the liquid/air interface is illustrated in FIG. 8 and described in more detail below. The solar cell 501 may be a tandem solar cell in one embodiment.

Figures 3A, 3B, 3C, 3D, 3E:
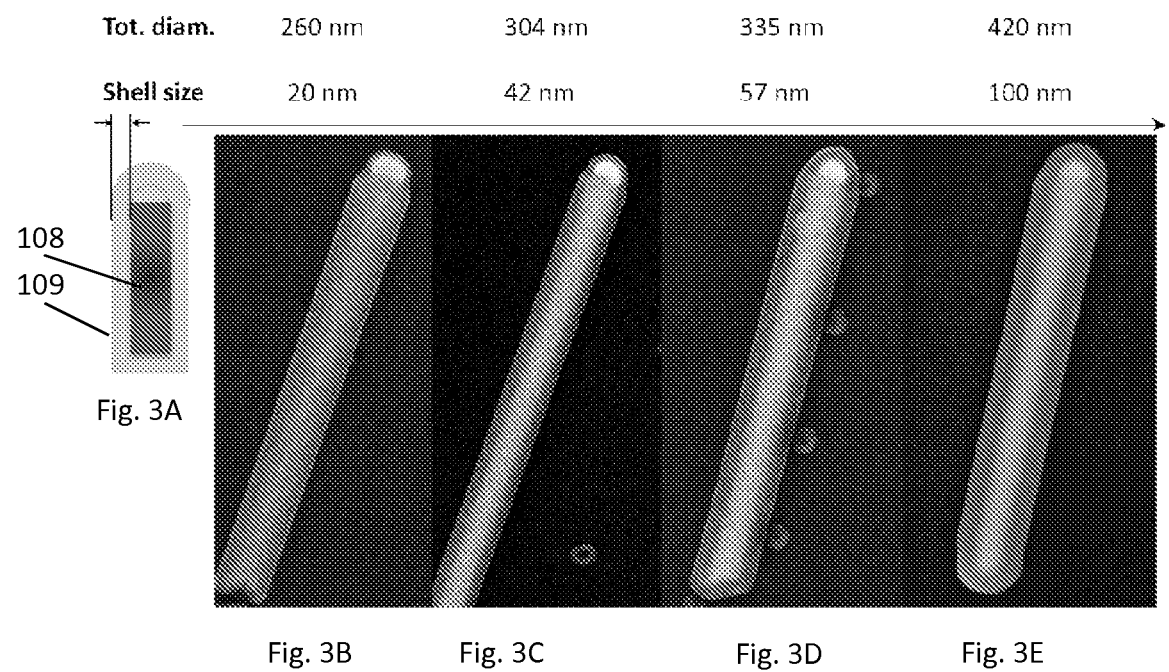
FIG. 3A is a schematic illustration of an encapsulated nanowire and FIGS. 3B-3E are micrographs illustrating nanowires encapsulated in a uniform silica shell and demonstrating how size and thereby spacing can be controlled.
Figures 4A, 4B, 4C, 4D:
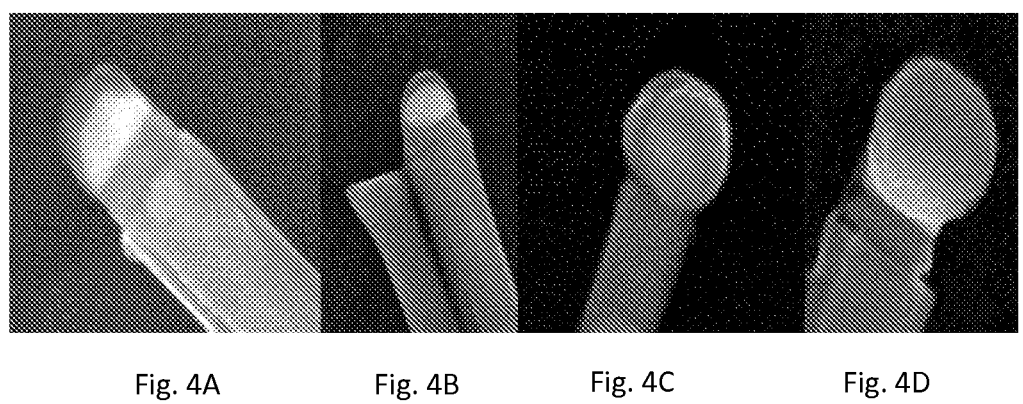
FIGS. 4A-4D are micrographs of nanowires with a polystyrene shell formed selectively around the seed particle.

FIG. 3A is a schematic illustration of an encapsulated nanowire 108 in a uniform shell 109. FIGS. 3B-3E are micrographs illustrating nanowires encapsulated in a uniform silica shell and demonstrating how size and thereby spacing can be controlled. The diameter of the nanowire 108 in each example is about 220 nm. A thicker shell 109 encapsulating the nanowires 108 results in greater spacing between the nanowires 108 when the shells 109 contact each other. The shell thickness is 20 nm, 42 nm, 57 nm and 100 nm in FIGS. 3B to 3E, respectively.

FIGS. 4A-4D are micrographs of nanowires with a polystyrene shell formed selectively around the seed particle 108A. As shown in FIGS. 4A-4D, polystyrene forms adherent, non-porous shells.

Figure 5:
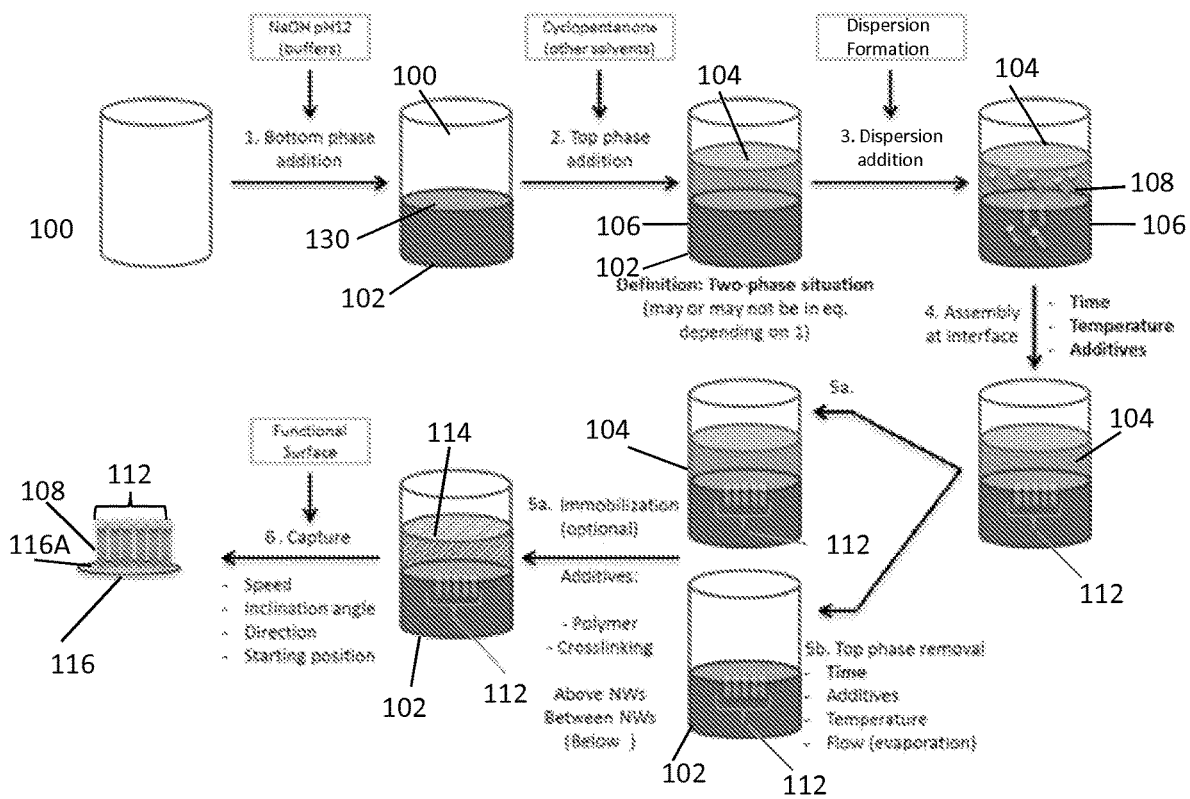
FIG. 5 is a schematic illustration of a method of capturing and aligning an assembly of nanowires.

FIG. 5 illustrates of a method of capturing and aligning an assembly of nanowires according to an embodiment. In a first step 1 of this embodiment, a first liquid is put in a container 100 to form the bottom phase 102. Any liquid holding container 100 may be used, such as a beaker, jar, barrel, etc. In an embodiment, the first liquid is an aqueous basic solution (pH greater than 7), such as a NaOH solution or another basic solution. The pH of the solution may be in a range of 9-13, such as 10-12. Optionally, one or more buffers may be added to the first liquid. In a second step 2, a second liquid is added to the container 100 to form the top phase 104. The first and second liquids are selected so that they phase separate and form an interface 106 between the top 104 and bottom 102 phases. In an embodiment, the top phase 104 comprises a liquid such as cyclopentanone which is immiscible or only partially miscible/partially immiscible with the bottom phase 102.

In a third step 3, a nanowire dispersion is added to the container 100. The nanowires 108 in the nanowire dispersion have a random orientation when initially added to the container 100 and may be found in both the bottom 102 and top 104 phases. The nanowires 108 may comprise a differential shell 111 as described above. In a fourth step 4, the nanowires 108 are provided to the interface and are preferably aligned/assembled at the interface to form an assembly 112 of nanowires 108. As discussed above, the liquid used to form the nanowire dispersion may be the same as either the first or second liquid or be different from either the first or the second liquids.

As illustrated in FIG. 5, in one embodiment, a majority of the nanowires 108 in the container 100 are located at the interface 106. Preferably at least 50% of the nanowires 108 (such as 50-100%, such as more than 70%, such as 75-99%, such as more than 80%, such as 90-99%) in the container 100 are located at the interface 106, while no nanowires or a minority of the nanowires are located in the first and/or the second liquid away from the interface.

Preferably, a majority of the nanowires 108 in the container 100 align (e.g. self align) to form the assembly 112 of nanowires 108 at the interface 106. Preferably at least 50% of the nanowires 108 (such as 50-100%, such as more than 70%, such as 75-99%, such as more than 80%, such as 90-99%) in the container 100 align (are oriented unidirectionally with respect to each other) to form the assembly 112 of nanowires 108 at the interface 106. A minority of the nanowires 108 located at the interface 106 may be randomly oriented or aligned in a direction different from the unidirection shared by the majority of the nanowires at the interface or be arranged randomly without preferred orientation.

Preferably, the majority of the nanowires 108 aligned at the interface 106 are aligned substantially perpendicular, such as within 20', such as within 10° of perpendicular, to the interface 106 with the same end (e.g. the catalyst particle end) pointing up. One part (e.g., lower part) of the nanowires 108 is located in liquid 102 and another part (e.g., upper part) of the nanowires 108 is located in liquid 104.

Alternatively, the majority of the nanowires 108 in the container 100 located at the interface 106 may be aligned in a direction which is not substantially perpendicular to the interface 106, (e.g. at an angle between 0 and 89 degrees with the interface 106) or may be located in a random orientation at the interface.

However, it is not necessary that all of the nanowires 108 in the container 100 align to form the assembly 112. The minority of the nanowires not located at the interface 106 may be randomly oriented or aligned in a direction which is the same or different from the unidirection direction shared by the majority of the nanowires at the interface.

Alignment/assembly may occur with the simple passage of time. However, the alignment/assembly of the nanowires may be assisted with the addition of additives to the bottom 102 and/or top 104 phases. Alternatively, the temperature of the system (e.g. the container 100, top 104 and bottom 102 phases and the nanowires 108) may be changed (either lowered or raised as desired) to expedite alignment/assembly of the nanowires 108.

In one embodiment described above, the dielectric shell comprises a single shell 109 which encapsulates both the metal catalyst particle seed portion 108A and the semiconductor nanowire portion 108B of the nanowire 108, as shown in FIG. 3A.

In another embodiment described above, the dielectric shell comprises the differential shell 111 comprising a first portion 107 or 109 which encapsulates the seed portion 108A and a second portion 109 or 107 which encapsulates the nanowire portion 108B, as shown in FIG. 2C. The first portion of the shell is more hydrophobic or hydrophilic than the second portion such that substantially all seed portions 108A are located above or below the liquid interface (i.e., such that the nanowires are aligned at the interface with at least 90% of the seeds pointing up or down with respect to the interface).

In another embodiment, the dielectric shell encapsulates the seed portion 108A or nanowire portion 108B, and the other of the seed or the nanowire portion is functionalized with a compound which is more hydrophobic or hydrophilic than the dielectric shell such that substantially all seed portions 108A are located above or below the liquid interface (i.e., such that the nanowires are aligned at the interface with at least 90% of the seeds pointing up or down with respect to the interface). In other words, one of the shell portions 107, 109 may be replaced with a functionalization which is more hydrophobic or hydrophilic than the remaining shell portion.

Thus, when the batch of nanowires is located at a liquid/liquid, liquid/solid, or liquid/air interface, the alignment of the nanowires is normal to the interface, and the spacing between individual nanowires controlled by the thickness of the shell is parallel to the interface.

Two alternative 5a, 5b are illustrated for the optional fifth step. In the first option 5a, the top or bottom phase 102, 104 is treated to solidify the phase and thereby immobilize the nanowires 108 within. As discussed above, solidification may be accomplished by adding a solidification agent (e.g., a polymer or a precursor, such as a monomer) to the top or bottom phase 102, 104 followed by irradiating or heating the top or bottom phase 102, 104 to cross-link the precursor to form nanowires embedded in a polymer. Alternatively, the solidification may be achieved by removing any solvent from the polymer-containing phase/layer, i.e. without chemical crosslinking. That is, the polymer containing phase solidifies as the solvent evaporates, resulting in a hardened layer.

In an alternative option 5b, the top phase 104 is partially or fully removed. The top phase 104 may be removed by the passage of time (e.g., evaporation or by dissolution into the bottom phase 102), by the assistance of additives, by raising the temperature of the liquids (to speed up evaporation) or by decanting. In this manner, one end of the nanowires is exposed (i.e. not fully immersed in the top phase 104).

In step 6, the assembly 112 of nanowires 108 is transferred to (captured on) a substrate 116. In an embodiment, the capture surface 116A of the substrate 116 is functionalized to aid in securing the assembly 112 of nanowires 108. In an embodiment, the substrate 116 is submerged below the nanowire assembly 112 and oriented such that the capture surface 116A of the substrate 116 is parallel to the interface 106 (i.e. the capture surface 116 is perpendicular to the nanowires 108). The substrate 116 is then slowly lifted to contact the assembly 112 of nanowires 108. If the top or the bottom phase is solidified as described above, then the solidified phase is removed from the container on the capture surface of the substrate together with the nanowire assembly.

In an alternative embodiment, the substrate 116 is dipped into the first and second liquids at an angle θ to the interface 106 between the top 104 and bottom 102 phases. Contact is then made between the capture surface 116A of the substrate 116 and the assembly 112 of nanowires 108. The substrate 116 may then be slowly dragged through and/or withdrawn from the first and/or second liquids (only the first liquid if step 5b is followed) with the nanowires 108 perpendicular to the capture surface 116A. In general, the speed of substrate withdrawal, the inclination angle, the direction of withdrawal and/or the starting position may be varied to enhance the nanowire assembly attachment to the capture surface and withdrawal from the container.

Preferably, when the assembly 112 of nanowires 108 is transferred to the substrate 116, at least 50% of the nanowires 108 (such as 50-100%, such as more than 70%, such as 75-99%, such as more than 80%, such as 90-99%) are aligned with respect to the surface of the substrate. Thus, the majority of the nanowires 108 at the interface 106 may aligned with respect to each other (e.g. perpendicular or non-perpendicular to the interface 106) or be randomly arranged with respect to each other. However, when the nanowires are transferred to the substrate 116, the majority of the nanowires are aligned with respect to each other and with respect to the capture surface 116A of the substrate 116, such as substantially perpendicular (e.g., −20 to 20 degrees, such as −10 to 10 degrees such as 0 degrees) to the capture surface 116A. In an embodiment, the nanowires 108 are aligned with the nanoparticle 108A containing side of the nanowire 108 distal from the capture surface 116A of the substrate 116. Alternatively, the nanowires 108 are aligned with the nanoparticle 108A containing side of the nanowire 108 proximal to the capture surface 116A of the substrate 116. Thus, in an embodiment, less than 50% of the nanowires 108 may be aligned at the liquid/liquid interface 106 but more than 50% of the nanowires 108, (such as more than 70%, such as more than 80%) of the nanowires 108 are aligned on the substrate 116.

In an embodiment, the substrate 116 with the captured assembly 112 of nanowires 108 can be placed into a solar cell 501 if the nanowires 108 have a pn junction 508C, as shown in FIG. 8. For example, as schematically illustrated in FIG. 8, the substrate 120 contains semiconductor (e.g., GaAs, InP, etc.) nanowires 108 positioned substantially perpendicular (e.g., with the longest axis 80 to 100 degrees, such as 90 degrees) to upper capture surface of the substrate. The nanowires 108 in this embodiment have an axial pn junction 508C located between a lower first conductivity type (e.g., n or p type) segment 508A and an upper second conductivity type (e.g., p or n type) segment 508B of the opposite conductivity type. In the solar cell 501, electrodes provide electrical contact to the nanowires 108. For example, the solar cell 501 may contain an upper electrode (e.g., transparent electrode) 510 in electrical contact with the upper segment 508B of the nanowires and an electrically conductive or semiconductor substrate 520 may provide an electrical contact to the lower segment 508A of the nanowires. An insulating or encapsulating material 512 may be located between the nanowires 108. Alternatively, the nanowires may contain a radial rather than an axial pn junction, in which case segment 508B is formed as a shell surrounding a nanowire core 508A such that the pn junction extends substantially perpendicular to the substrate capture surface.

Figure 6:
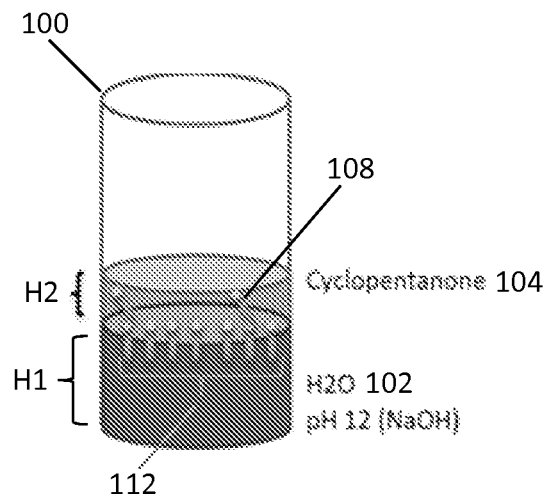
FIG. 6 is a schematic illustration of another method of aligning and assembling nanowires.

FIG. 6 is a schematic illustration of aligned and assembled nanowires according to an exemplary embodiment. In this example, a glass container may be filled with 5000 μl of an aqueous liquid of pH 12.2 adjusted using NaOH to form the bottom phase 102 having a thickness H1. Then, 1000 μl cyclopentanone may be added to form the top phase 104 having a thickness H2. An arbitrary amount of a nanowire dispersion of nanowires 108 in cyclopentanone may then be added. The nanowires 108 are allowed to spontaneously assemble at the interface 106. The glass container 100 may be rapidly cooled.

The assemblies 112 of nanowires 108 can be transferred by immersing a substrate 116 with a functionalized capture surface 116A into the liquids and moving it through the liquid interface from below, while keeping the functionalized capture surface 116A inclined at a near vertical orientation (θ>60 degrees inclination, such as 65-115 degrees) to the interface 106. The functionalized capture surface 116A can be prepared by coating a piece of silicon wafer in an aqueous solution of polyethyleneimine. The functionalized surface with transferred assemblies 112 of nanowires 108 is then dried at ambient conditions.

Figure 7:
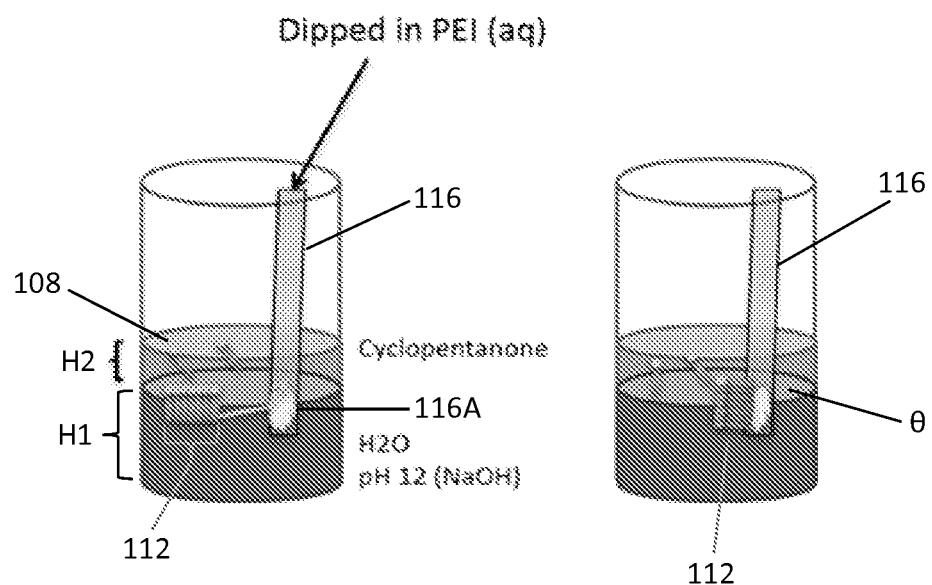
FIG. 7 is a schematic illustration of a method of capturing and aligning an assembly of nanowires.

FIG. 7 is a schematic illustration of capturing and aligning an array of nanowires according to another embodiment. In this embodiment, a substrate 116 with a functionalized capture surface 116A is dipped into the liquid/liquid two-phase system. The assemblies 112 of nanowires 108 are captured on the capture surface 116A of the substrate 116 as the substrate 116 is withdrawn from the liquid/liquid two-phase system.

In an embodiment, 5000 μl of aqueous NaOH adjusted to pH 12.2 may be added to a container 100. Then, 1000 μl of cyclopentanone may be added to establish a liquid/liquid two-phase system (i.e. bottom phase 102 and top phase 104). An arbitrary amount of a nanowires 108 dispersed in cyclopentanone may be gently added. The glass container 100 may be rapidly cooled resulting in formation of assemblies 112 of nanowires. The majority of the remaining top phase 104 may then be manually removed.

The interfacial assemblies 112 of nanowires 108 may be transferred by lowering a substrate 116 with a functionalized capture surface 116A onto the liquid until contact is made with the assemblies 112. Then, the substrate 116 may be pulled up from the interface while keeping the functionalized capture surface 116A parallel to the liquid interface, analogous to the Langmuir-Schaefer method. The functionalized capture surface may be prepared by coating a piece of silicon wafer in a polymer that solidifies upon contact with the bottom phase (e.g. a thickening polymer), thereby immobilizing the assemblies 112 of nanowires 108. The functionalized capture surface 116A with the transferred assemblies 112 of nanowires 108 may then be dried at ambient conditions.

In an embodiment, the nanowires 108 are oriented in such a way that their longest dimension (i.e. the nanowire length along the longest axis) is positioned perpendicular to the liquid interface 106. This orientation may be obtained, for instance, due to the interaction between the nanowire shells 107, 109 and the top and bottom liquid phases 102, 104.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of forming a nanowire close-packed structure comprising:
   providing a nanowire batch comprising nanowires with a seed portion and a nanowire portion;
   for each nanowire in the nanowire batch, forming a first shell encapsulating one portion of the nanowire and forming a second shell encapsulating a second portion of the nanowire, wherein the second shell material is different from the first shell material wherein the first and the second shells are not formed during an aerotaxy process or MOCVD growth of the nanowires; and
   orienting and aligning the nanowires containing the first and second shells at liquid/liquid or liquid/air interface wherein the alignment of the nanowires is normal to the interface, wherein the second shells of adjacent nanowires contact each other and wherein the spacing between adjacent individual nanowires at the interface is controlled by the thicknesses of the second shells.

2. The method of claim 1, wherein the orientation of each of the nanowires is determined by a configuration of the first shell material and the second shell material and properties of the interface materials, wherein the interface material is selected such that one of the shell portions interacts with one of the interface materials and the other shell portion interacts with the other interface material.

3. The method of claim 1, wherein the oriented and aligned nanowires are transferred to a solid substrate.

4. The method of claim 3, further comprising providing the solid substrate containing the oriented and aligned nanowires to a solar cell.

5. The method of claim 1, wherein the nanowires have a substantially unidirectional orientation.

6. The method of claim 1, wherein the nanowires are semiconductor nanowires.

7. A method of forming a nanowire close-packed structure comprising:
   providing a nanowire batch comprising nanowires each with a seed portion and a nanowire portion and a dielectric shell encapsulating at least a portion of the nanowires, wherein the dielectric shell is not formed during an aerotaxy process or MOCVD growth of the nanowires; and
   orienting and aligning the nanowires containing the dielectric shell perpendicular to an interface of a first liquid with one of a second liquid or air, wherein the dielectric shells of adjacent nanowires contact each other, and wherein a thickness of the discrete dielectric shells determines a level of orientation and alignment of the nanowires.

8. The method of claim 7, wherein a spacing between adjacent individual nanowires at the interface is controlled by the thicknesses of the dielectric shells.

9. The method of claim 8, wherein the thickness of the dielectric shell of an individual nanowire is selected such that the average spacing of the nanowires as measured from a midpoint of one nanowire to the adjacent nanowire is larger than 200 nm and smaller than 700 nm.

10. The method of claim 9, wherein the thickness of the dielectric shell of an individual nanowire is at least 2 nm, the nanowire portion comprises a semiconductor nanowire portion, the seed portion comprises a metal catalyst particle.

11. The method of claim 7, wherein an aspect ratio of the nanowire comprising the shell is lower than an aspect ratio of each nanowire without a shell.

12. The method of claim 7, wherein the dielectric shell of each nanowire comprises a single shell which encapsulates both the seed portion and the nanowire portion.

13. The method of claim 7, wherein the dielectric shell encapsulates the seed portion or nanowire portion, and the other of the seed or the nanowire portion is functionalized with a compound which is more hydrophobic or hydrophilic than the dielectric shell.

* * * * *